United States Patent
Chuang et al.

(10) Patent No.: US 8,655,483 B2
(45) Date of Patent: Feb. 18, 2014

(54) WAFER CASSETTE TRANSPORTATION METHOD AND SYSTEM THEREOF

(75) Inventors: Chin-Hsiao Chuang, Taipei (TW); Yu-Kun Chen, Taipei County (TW)

(73) Assignee: Inotera Memories, Inc., Taoyuan County (TW)

( * ) Notice: Subject to any disclaimer, the term of this patent is extended or adjusted under 35 U.S.C. 154(b) by 1540 days.

(21) Appl. No.: 12/243,323

(22) Filed: Oct. 1, 2008

(65) Prior Publication Data

US 2010/0023158 A1  Jan. 28, 2010

(30) Foreign Application Priority Data

Jul. 25, 2008 (TW) .............................. 97128294 A

(51) Int. Cl.
*G06F 7/00* (2006.01)
(52) U.S. Cl.
USPC .......................................................... 700/228
(58) Field of Classification Search
USPC ........................................ 700/228, 213, 214
See application file for complete search history.

(56) References Cited

U.S. PATENT DOCUMENTS

| 2002/0143427 A1* | 10/2002 | Chao | 700/213 |
| 2004/0039469 A1* | 2/2004 | Lin | 700/100 |
| 2008/0021593 A1* | 1/2008 | Yu et al. | 700/228 |

* cited by examiner

*Primary Examiner* — Ramya Burgess
(74) *Attorney, Agent, or Firm* — Rosenberg, Klein & Lee

(57) ABSTRACT

A wafer cassette transportation method includes the steps: (a) Provide a monitoring system, overhead platforms, a detection system, and a plurality of transportation systems; (b) The detection system detects whether or not any overhead platform has a wafer cassette and generates and transmits first signals to the monitoring system; (c) The monitoring system reads the first signals and instructs one of the transportation systems to move the wafer cassette to an empty overhead platform; (d) The detection system detects whether or not any overhead platform has a wafer cassette and generates and transmits second signals to the monitoring system; and (e) The monitoring system reads the second signals and instructs another transportation system to move the wafer cassette away from the overhead platform, so as to enhance the transportation speed of the wafer cassette and lower the manufacturing cost. The present invention further provides a wafer cassette transportation system.

18 Claims, 5 Drawing Sheets

WAFER CASSETTE TRANSPORTATION METHOD AND SYSTEM THEREOF

BACKGROUND OF THE INVENTION

1. Field of the Invention

The present invention relates to a transportation method and its system, and more particularly to a wafer cassette transportation method and its system.

2. Description of Related Art

With reference to FIG. 1 for a conventional wafer cassette (or wafer carrier) transportation method, a transportation system includes a central monitoring system, a plurality of transportation systems (OHT Systems: Overhead Transportation Systems), and an automatic warehouse system (Stocker), wherein different transportation systems are respectively installed in a factory at positions of different heights and electrically connected with the central monitoring system. The stocker generally comprises a goods receiving unit, a storage shelf, a forklift, a conveyor belt, and a goods exiting unit. The wafer cassette sequentially goes through the aforementioned goods receiving unit, storage shelf, forklift, conveyor belt, and goods exiting unit before it is transferred to another transportation system.

Since the wafer cassette has to go through the aforementioned complicated procedure in the stocker before it is transferred from one transportation system to another transportation system, the stocker creates many limitations and act as a bottleneck for operators act upon so as to improve the overall transportation speed of the transportation system to a desired level, and the volume of the stocker is very large, which occupies a considerable area of a factory, and its manufacturing cost is very high, and thus it creates burdens to manufacturers.

In view of the foregoing shortcomings of the prior art, the inventor of the present invention based on years of experience conducted extensive researches and experiments, and finally invented a wafer cassette transportation method and developed a wafer cassette transportation system to overcome the shortcoming of the prior art.

SUMMARY OF THE INVENTION

Therefore, it is a primary objective of the present invention to provide a wafer cassette transportation method and a system thereof, wherein operators can improve the speed of transporting wafer cassettes up to a desired level without using or occupying a large area of a factory, thereby the present invention can lower the manufacturing cost.

To achieve the foregoing objective, the present invention provides a wafer cassette transportation method, comprising the following steps:

1. Provide a monitoring system, a plurality of overhead platforms, a detection system, and a plurality of transportation systems, wherein the height at which each transportation system is located varies, and the detection system detects whether or not any overhead platform has a wafer cassette and generates a plurality of first signals to be transmitted to the monitoring system.

2. The monitoring system reads the first signals and instructs one of the transportation systems to transport the wafer cassette to an empty overhead platform without a wafer cassette.

3. The detection system detects whether or not any overhead platform has a wafer cassette again and generates a plurality of second signals to be transmitted to the monitoring system.

4. The monitoring system reads the second signals and instructs another transportation system to move the wafer cassette away from the overhead platform.

The present invention also provides a wafer cassette transportation system, comprising: a monitoring system; a plurality of overhead platforms; and a detection system, wherein the detection system is electrically coupled to the monitoring system and provided for detecting whether or not any overhead platform has a wafer cassette; and a plurality of transportation systems, each coupled to the monitoring system, and provided for transporting a wafer cassette, wherein the height at which each transportation system is situated varies.

The present invention has the following advantages: The wafer cassette can be transferred from one transportation system to another transportation system through the overhead platform, and thus the transportation process become much simpler, and operators can improve the transportation speed to a desired level easily. Since the overhead platform is not installed on a floor of a factory, and thus the present invention can increase the available using spaces in the factory. In addition, due to the general low cost of the overhead platform, the present invention can be implemented cheaply and thus lowers the manufacturing cost greatly and enhances the product competitiveness.

The above and other objects, features, and advantages of the present invention will become apparent from the following detailed description when viewed with the accompanying drawing.

DETAILED DESCRIPTION OF PREFERRED EMBODIMENTS

Figure 1:
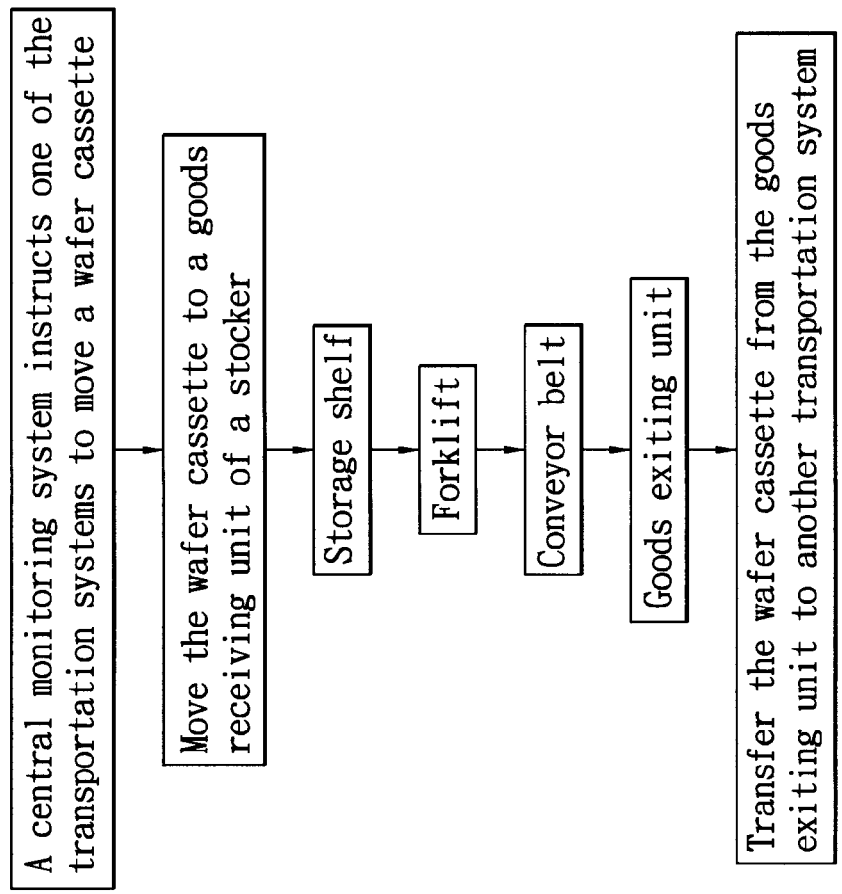
FIG. 1 is a flow chart of a wafer cassette transportation method in accordance with a prior art.
Figure 2:
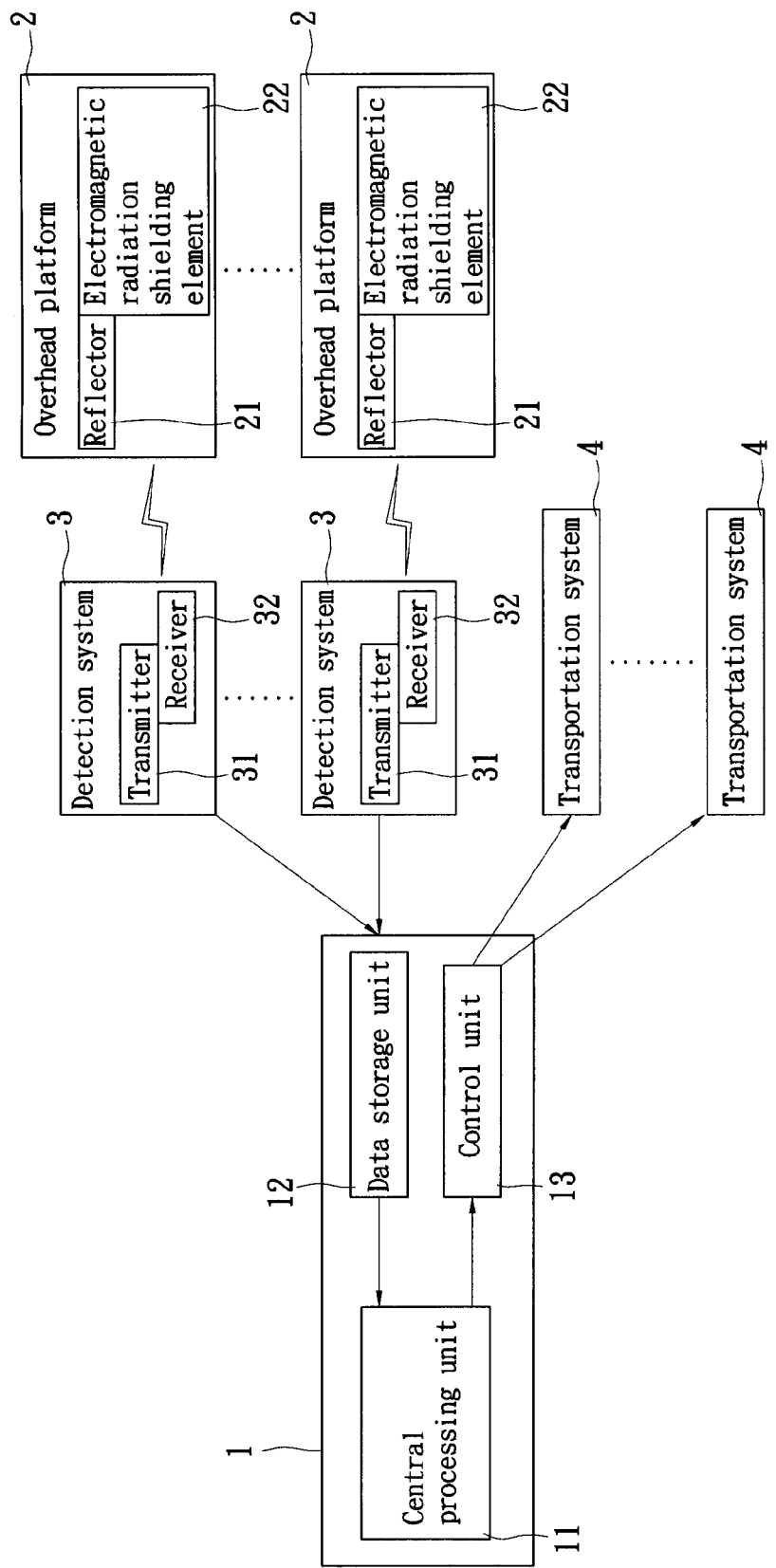
FIG. 2 is a block diagram of a wafer cassette transportation system in accordance with the present invention.

With reference to FIG. 2 for a wafer cassette transportation system of the present invention, the wafer cassette transportation system comprises a monitoring system 1, a plurality of overhead platforms 2, a detection system 3, and a plurality of transportation systems 4; wherein the detection system 3 is electrically connected to the transportation systems 4 and the monitoring system 1; the monitoring system 1 comprises a central processing unit 11, a data storage unit 12, and a control unit 13; the data storage unit 12 and the control unit 13 are electrically coupled to the central processing unit 11, and the detection system 3 comprises a plurality of transmitters 31 and a plurality of receivers 32.

Figure 3:
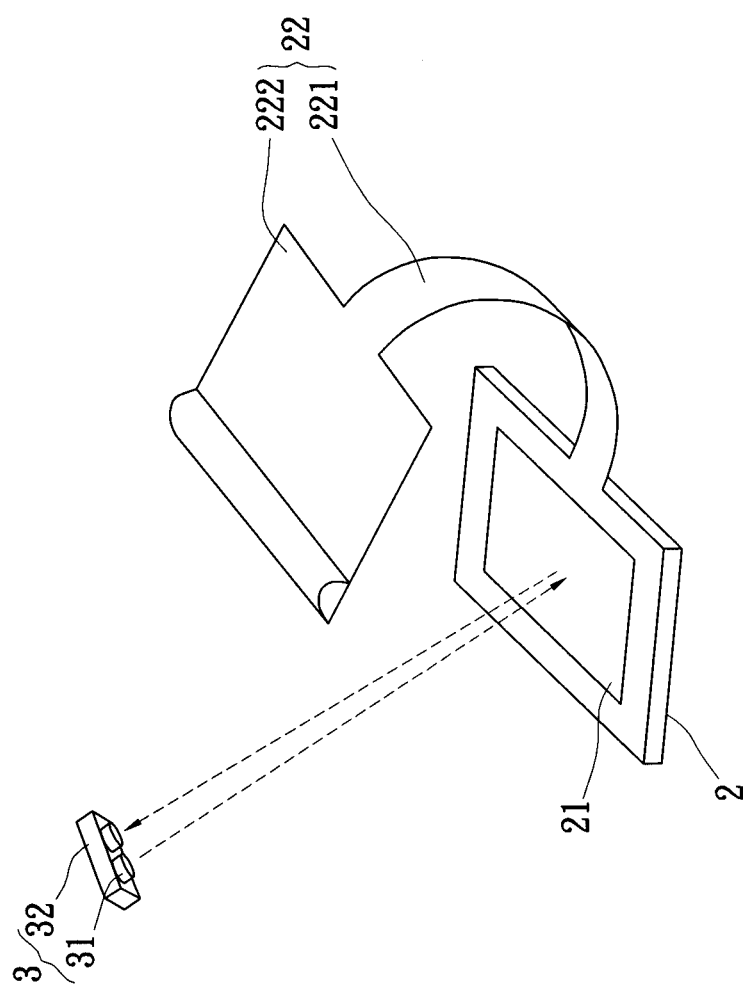
FIG. 3 is a schematic view of a detection system detecting a status at an overhead platform in accordance with the present invention.

In FIG. 3, each overhead platform 2 works together with a transmitter 31 and a receiver 32, wherein the transmitter 31 is an infrared transmitter or a Bluetooth transmitter, and the receiver 32 is an infrared receiver or a Bluetooth receiver. Each overhead platform 2 is connected to a reflector 21 and an electromagnetic radiation shielding element 22, wherein the electromagnetic radiation shielding element 22 is provided for shielding electromagnetic waves emitted from the transmitter 31, and the electromagnetic radiation shielding element 22 and the overhead platform 2 are integral components made of metal.

The electromagnetic radiation shielding element 22 comprises a resilient arm 221 and a shield plate 222, such that if a wafer cassette 5 is placed onto the overhead platform 2, the wafer cassette 5 will be pressed on the top surface of the shield plate 222 of the overhead platform 2 so as to attach the shield plate 222 tightly onto the top surface of the overhead platform 2, thereby the reflector 21 is sheltered by the shield plate 222, and the receiver 32 will not receive any electromagnetic wave reflected from the reflector 21, and the monitoring system 1 can know that a wafer cassette 5 is on the overhead platform 2. On the other hand, if no wafer cassette 5 is on the overhead platform 2, the receiver 32 will receive an electromagnetic wave reflected from the reflector 21, so that the monitoring system 1 can know that there is no wafer cassette 5 on the overhead platform 2.

Figure 4:
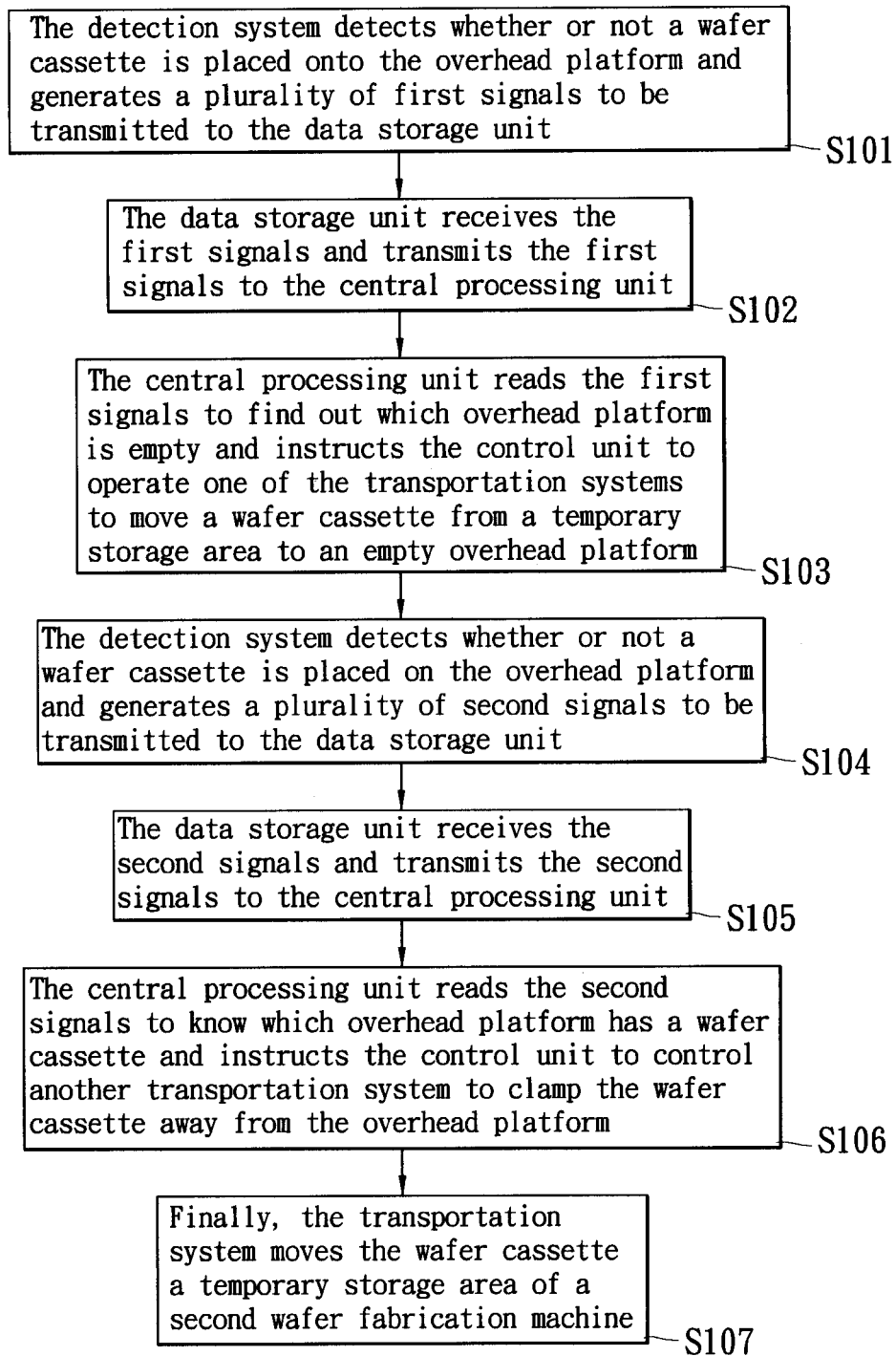
FIG. 4 is a flow chart of a wafer cassette transportation method in accordance with the present invention.
Figure 5:
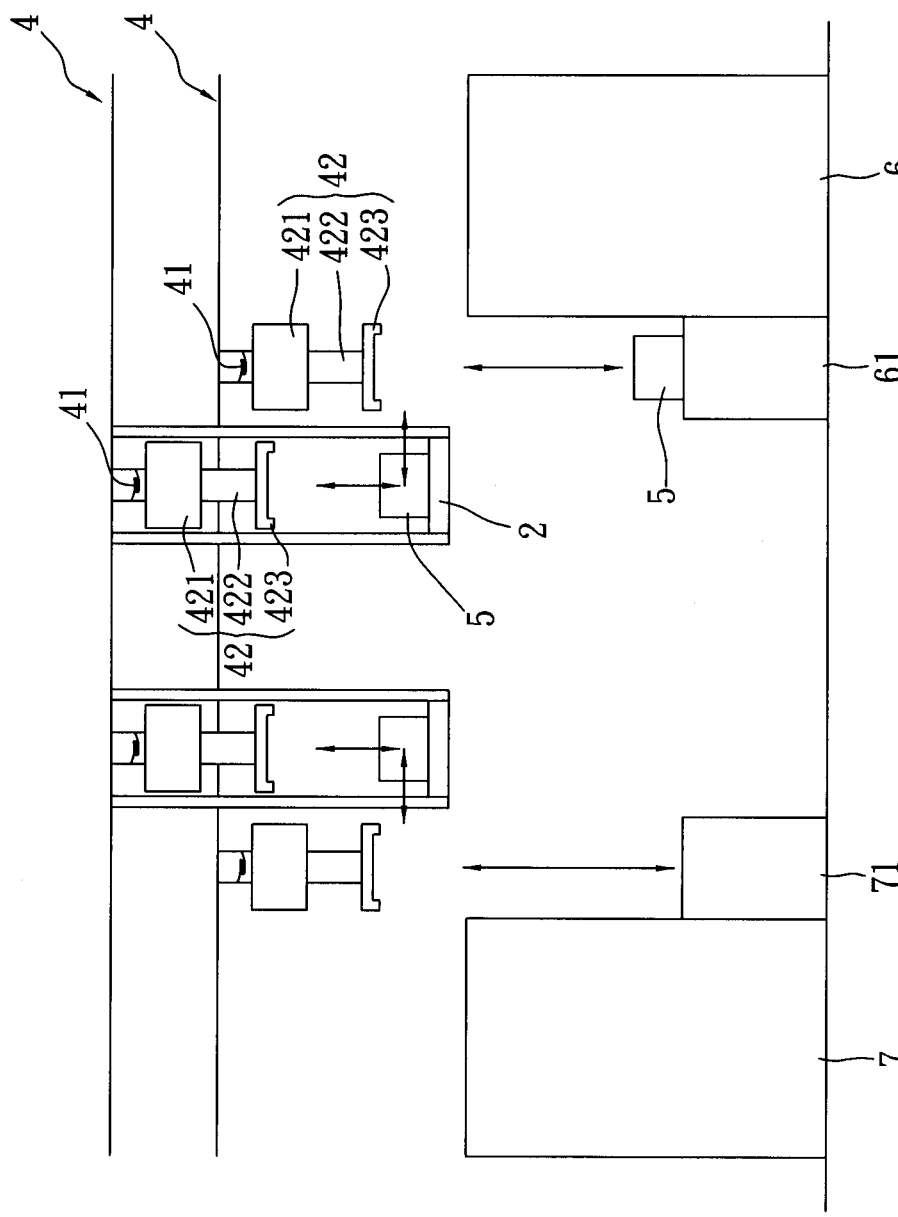
FIG. 5 is a schematic view of FIG. 4.

With reference to FIGS. 2, 4 and 5 for a wafer cassette transportation method in accordance with the present invention, the process of moving a wafer cassette 5 from a temporary storage area 61 of a first wafer fabrication machine 6 to a temporary storage area 71 of a second wafer fabrication machine 7 comprises the following steps:

S101: The detection system 3 detects whether or not a wafer cassette 5 is placed onto the overhead platform 2 and generates a plurality of first signals to be transmitted to the data storage unit 12.

S102: The data storage unit 12 receives the first signals, and transmits the first signals to the central processing unit 11.

S103: The central processing unit 11 reads the first signals to find out which overhead platform 2 is empty and instructs the control unit 13 to operate one of the transportation systems 4 to move a wafer cassette 5 from a temporary storage area 61 to an empty overhead platform 2, wherein each transportation system 4 comprises an overhead rail 41 and a plurality of transportation equipments 42, and different transportation systems 4 are installed at the overhead rails 41 at different heights of the factory; each transportation equipment 42 comprises a slide base 421, a contractible tube 422, and a clamping element 423; the slide base 421 is slidably coupled to the overhead rail 41, the contractible tube 422 is coupled between the slide base 421, and the clamping element 423; the contractible tube 422 drives the clamping element 423 to move up-and-down or left-and-right. The control unit 13 is provided for controlling the movement of the slide base 421, the contractible tube 422, and the clamping element 423.

S104: The detection system 3 detects whether or not a wafer cassette 5 is placed on the overhead platform 2 and generates a plurality of second signals to be transmitted to the data storage unit 12.

S105: The data storage unit 12 receives the second signals, and transmits the second signals to the central processing unit 11.

S106: The central processing unit 11 reads the second signals to know which overhead platform 2 has a wafer cassette 5 and instructs the control unit 13 to control another transportation system 4 to clamp the wafer cassette 5 away from the overhead platform 2. Now, the wafer cassette 5 is transferred from one transportation system 4 to another transportation system 4 successfully.

S107: Finally, the transportation system 4 moves the wafer cassette 5 to a temporary storage area 71 of a second wafer fabrication machine 7.

In Steps S103 and S106, the transportation equipments 42 will not be operated at the same overhead platform 2, and the central processing unit 11 can instruct the control unit 13 to operate the transportation system 4 nearest to the overhead platform 2 to move the wafer cassette 5 in order to save transportation time.

The wafer cassette transportation method and its system in accordance with the present invention have the following advantages:

1. The wafer cassette 5 can be transferred from a transportation system 4 to another transportation system 4 simply through the overhead platform 2, and thus the transportation process becomes much simpler and operators can improve the transportation speed to a desired level easily.

2. Since the overhead platform 2 is not installed on a floor of a factory, the factory can have more available using spaces.

3. The overhead platform 2 comes with a low price, and thus the present invention lowers the manufacturing cost greatly and enhances the product competitiveness.

4. The electromagnetic radiation shielding element 22 and the overhead platform 2 are integrally formed by a flexible metal, so that the shield plate 222 can be attached tightly onto a surface of the overhead platform 2, and the monitoring system 1 will not misjudge the actual conditions of the overhead platform 2.

Although the present invention has been described with reference to the preferred embodiments thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. A wafer cassette transportation method, comprising the steps of:
    providing a monitoring system, a plurality of overhead platforms, a detection system, and a plurality of transportation systems, wherein the height at which each transportation system is situated varies;
    the detection system detecting whether or not any overhead platform has a wafer cassette, and generating a plurality of first signals to be transmitted to the monitoring system;
    the monitoring system reading the first signals, and instructing one of the transportation systems to move the wafer cassette to an empty overhead platform without a wafer cassette;
    the detection system detecting whether or not any overhead platform has a wafer cassette again, and generating a plurality of second signals to be transmitted to the monitoring system; and
    the monitoring system reading the second signals, and instructing another transportation system to move the wafer cassette away from the overhead platform.

2. The wafer cassette transportation method of claim 1, wherein the monitoring system is electrically coupled to the detection system, and the monitoring system comprises a central processing unit, a data storage unit, and a control unit;
    the data storage unit is connected to the central processing unit;
    the control unit is coupled to the transportation systems and the central processing unit;
    the data storage unit receives the first signals and the second signals and transmits the first signals and the second signals to the central processing unit; and after the central processing unit reads the first signals and the second signals, the central processing unit instructs the control unit to control the transportation systems to move the wafer cassette.

3. The wafer cassette transportation method of claim 2, wherein the central processing unit instructs the control unit to control a transportation system nearest to the overhead platforms to move the wafer cassette.

4. The wafer cassette transportation method of claim 2, wherein each of the transportation systems comprises an overhead rail and a plurality of transportation equipments; the transportation equipments are slidably coupled onto the overhead rail, the transportation equipments are coupled to the control unit, and the control unit is provided for controlling the transportation equipments to move on the overhead rail and for controlling the transportation equipments to move the wafer cassette.

5. The wafer cassette transportation method of claim 4, wherein the plurality of transportation equipments will not be operated on the same overhead platform at the same time.

6. The wafer cassette transportation method of claim 4, wherein each of the transportation equipments comprises a slide base, a contractible tube, and a clamping element; the slide base is slidably coupled onto the overhead rail, and the contractible tube is coupled between the slide base and the clamping element.

7. The wafer cassette transportation method of claim 1, wherein the detection system comprises a plurality of transmitters, receivers, and reflectors; the reflectors are coupled onto the overhead platforms, and each overhead platform is coupled to an electromagnetic radiation shielding element.

8. The wafer cassette transportation method of claim 7, wherein the electromagnetic radiation shielding element and the overhead platform are integrally made of metal, the electromagnetic radiation shielding element comprises a resilient arm and a shield plate, and the resilient arm is coupled between the overhead platform and the shield plate.

9. The wafer cassette transportation method of claim 7, wherein the transmitters are infrared transmitters and the receivers are infrared receivers.

10. The wafer cassette transportation method of claim 7, wherein the transmitters are Bluetooth transmitters and the receivers are Bluetooth receivers.

11. A wafer cassette transportation system, comprising:
a monitoring system;
a plurality of overhead platforms;
a detection system, electrically coupled to the monitoring system, for detecting whether or not any overhead platform has a wafer cassette; and
a plurality of transportation systems, each coupled to the monitoring system, for transporting the wafer cassette, wherein the height at which each transportation system is located varies.

12. The wafer cassette transportation system of claim 11, wherein the monitoring system comprises a central processing unit, a data storage unit, and a control unit; the data storage unit is coupled to the central processing unit, and the control unit is coupled to the transportation systems and the central processing unit.

13. The wafer cassette transportation system of claim 11, wherein each of the transportation systems comprises an overhead rail and a plurality of transportation equipments; the transportation equipments are slidably coupled onto the overhead rail, and the transportation equipments are coupled to the control unit.

14. The wafer cassette transportation system of claim 13, wherein each of the transportation equipment comprises a slide base, a contractible tube, and a clamping element; the slide base is slidably coupled to the overhead rail, and the contractible tube is coupled between the slide base and the clamping element.

15. The wafer cassette transportation system of claim 11, wherein the detection system comprises a plurality of transmitters, receivers, and reflectors; the reflectors are coupled onto a surface of the overhead platforms, and each of the overhead platforms is coupled to an electromagnetic radiation shielding element.

16. The wafer cassette transportation system of claim 15, wherein the electromagnetic radiation shielding element and the overhead platform are integrally made of metal, the electromagnetic radiation shielding element includes a resilient arm and a shield plate, and the resilient arm is coupled between the overhead platform and the shield plate.

17. The wafer cassette transportation system of claim 11, wherein the transmitters are infrared transmitters and the receivers are infrared receivers.

18. The wafer cassette transportation system of claim 11, wherein the transmitters are Bluetooth transmitters and the receivers are Bluetooth receivers.

* * * * *